United States Patent [19]
Giewont et al.

[11] Patent Number: 5,449,631
[45] Date of Patent: Sep. 12, 1995

[54] PREVENTION OF AGGLOMERATION AND INVERSION IN A SEMICONDUCTOR SALICIDE PROCESS

[75] Inventors: Kenneth J. Giewont; Anthony J. Yu, both of Poughquag, N.Y.

[73] Assignee: International Business Machines Corporation, Armonk, N.Y.

[21] Appl. No.: 282,680

[22] Filed: Jul. 29, 1994

[51] Int. Cl.6 .................. H01L 21/283; H01L 21/336
[52] U.S. Cl. ..................... 437/41; 437/192; 437/200; 148/DIG. 19; 204/192.17
[58] Field of Search ............... 437/190, 192, 200, 41, 437/44; 204/192.17; 257/754; 748/DIG. 19

[56] References Cited

U.S. PATENT DOCUMENTS

| | | | |
|---|---|---|---|
| 4,180,596 | 12/1979 | Crowder et al. | 427/42 |
| 4,782,380 | 11/1988 | Shankar et al. | |
| 4,830,971 | 5/1989 | Shibata | 437/29 |
| 4,927,505 | 5/1990 | Sharma et al. | 204/34.5 |
| 5,164,333 | 11/1992 | Schwalke et al. | 437/200 |
| 5,196,360 | 3/1993 | Doan et al. | 437/41 |
| 5,341,016 | 8/1994 | Prall et al. | 257/412 |

FOREIGN PATENT DOCUMENTS 60-173872  9/1985  Japan.
3-292729  12/1991  Japan.

OTHER PUBLICATIONS

Nishiyama, A., et al., "A Thermally Stable Salicide Process . . . ", Jun. 12–13, 1990, VMIC Conf., pp. 310–316.
Georgiou, G., et al., "Thermal Stability Limits of Thin $TiSi_2$ . . . ", J. Electro Chem. Soc., 141(5), May 1994, pp. 1351–1356.
Lasky, J., et al., "Comparison of Transformation Low–Resistivity Phase and Agglomeration . . . ", IEEE Trans. Elec. Devices, 38(2), Feb. 1991, pp. 262–269.

*Primary Examiner*—T. N. Quach
*Attorney, Agent, or Firm*—Richard Lau; Alison D. Mortinger

[57] ABSTRACT

A conductor is fabricated by forming a layer of doped polysilicon on a semiconductor substrate, patterning the layer of doped polysilicon so as to form a conductor, forming a nitrogen-enriched metal film on the conductor, and converting the nitrogen-enriched metal film to a nitrogen-enriched metal silicide film, wherein nitrogen contained in the nitrogen-enriched metal silicide film provides for improved thermal stability thereof.

18 Claims, 2 Drawing Sheets

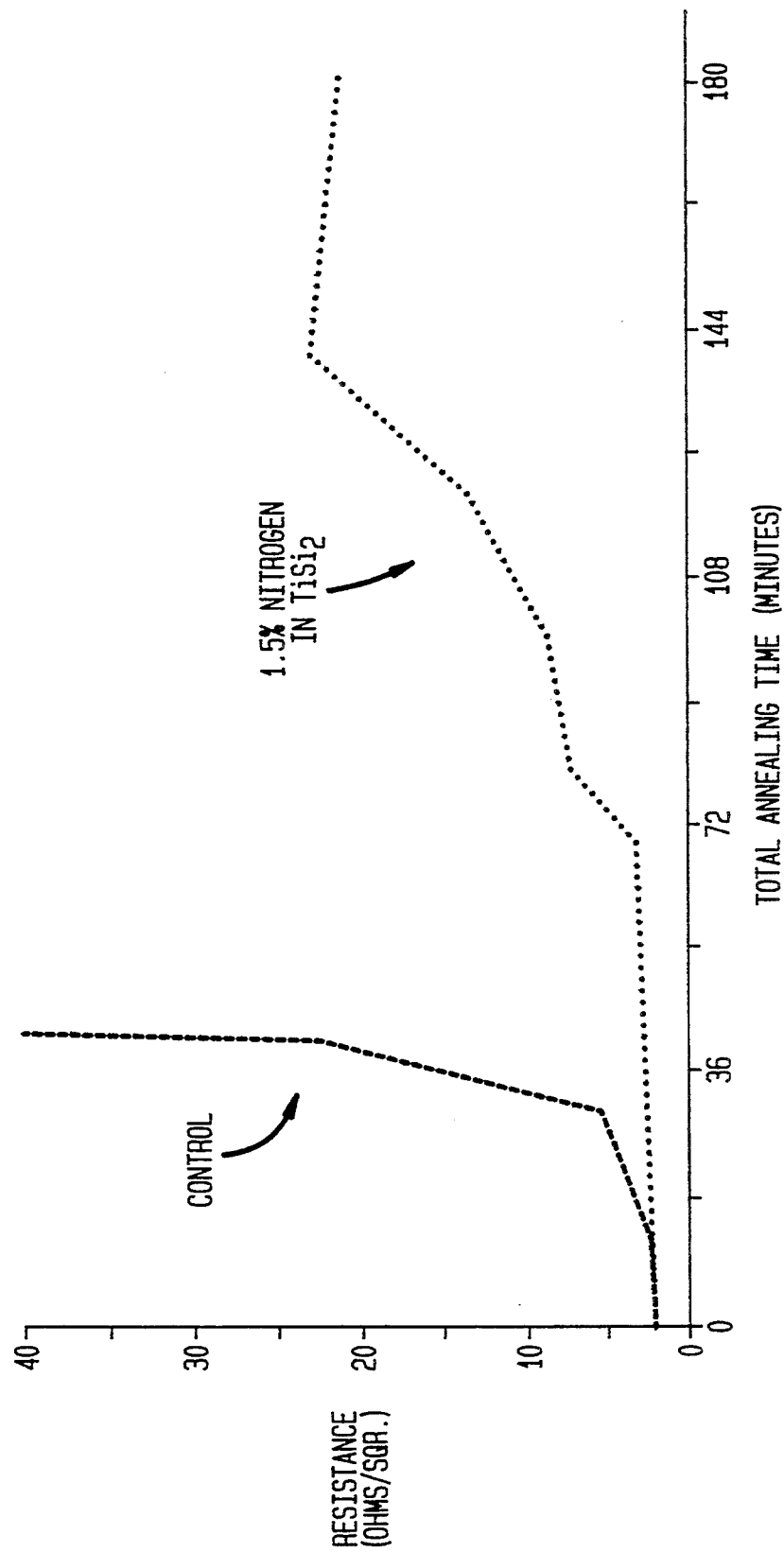

PREVENTION OF AGGLOMERATION AND INVERSION IN A SEMICONDUCTOR SALICIDE PROCESS

RELATED U.S. PATENT APPLICATIONS

This application is related to commonly assigned, simultaneously filed, U.S. patent application Ser. No. 08/282,681, Attorney Docket No. FI9-93-064, pending.

TECHNICAL FIELD

The present invention relates generally to semiconductor processes and, more particularly, to semiconductor salicide processes and, even more particularly, to prevention of agglomeration and inversion in a semiconductor salicide process.

BACKGROUND OF THE INVENTION

The use of advanced semiconductor lithography and etching processes has enabled reduction in the dimensions of semiconductor devices and a concomitant increase in device operating speed. However, this reduction in dimensions causes a corresponding decrease in the cross-sectional area of interconnect regions, thus leading to an increase in interconnection time delay resulting from both material and circuit parameters. A solution to the increase in interconnection time delay is to place a metal silicide layer on top of a doped polycrystalline silicon in order to lower the sheet resistance of the polycrystalline silicon interconnections and gain increased circuit speed. See, for example, U.S. Pat. No. 4,180,596, issued Dec. 25, 1979 to Crowder et al.

In a salicide (self-aligned silicide) process, polysilicon is deposited on a wafer and patterned to form a gate electrode structure, and insulating sidewall spacers are then formed so as to passivate the sidewalls of the gate electrode structure. Dopants are then implanted to form source and drain regions in the wafer, and the dopants are electrically activated by a high temperature anneal. Next, a thin metal film is deposited over the entire wafer, and the wafer is heated, such as in a nitrogen ambient, so as to selectively react the metal with exposed silicon to form silicide contacts over the source, gate and drain silicon. During such heating, the metal over the insulating sidewall spacers is converted to metal nitride, and the metal nitride is selectively etched and removed. A high temperature anneal is then used to reduce the resistivity of the silicide.

Addition of the metal silicide layer lowers the sheet resistance and thereby increases the circuit speed. However, for the reasons outlined hereinbelow, it is necessary for the metal silicide to demonstrate thermal stability during subsequent annealing.

A key technological problem is the agglomeration of metal silicide upon high temperature annealing, i.e., annealing at temperatures greater than approximately 800 degrees C. Agglomeration is a condition in which the metal silicide film has discontinuities caused by silicon diffusion and grain growth. At elevated temperatures, silicon within and under the metal silicide diffuse and eventually coalesce to form large silicon grains which break the continuity of the original metal silicide film. Accordingly, a narrow conductor constructed with an agglomerated silicide tends to show a significant increase in average sheet resistance. In this regard, localized breaks in the film can have very high resistance if the silicide is completely severed across the width of the line. As such, in high speed circuit applications requiring low resistance silicide conductors, agglomeration can result in performance degradation or total functional failure.

An objective in device manufacturing processing is therefore to identify a thermal process window in which the low resistance silicide will form and not agglomerate. This process window must be large enough to accommodate temperature and time variations without resulting in incomplete silicide conversion or agglomeration. The problem is highlighted, for example, when forming titanium silicide ($TiSi_2$) on P+ doped polysilicon. The activation energy for forming low resistivity C54 $TiSi_2$ on P+ doped polysilicon is higher than for forming low resistivity C54 $TiSi_2$ on undoped polysilicon, and this increased activation energy causes the manufacturing process window to shrink even further.

A related thermal stability problem of silicide conductors occurs specifically on poly/silicide conductors which are used for gates on N-type or P-type MOS transistors. Upon high temperature anneals, the condition of agglomeration can extend to a condition referred to as "inversion", in which the silicide and underlying polysilicon exchange position. At high temperatures, silicon and silicide diffuse in opposite directions which eventually results in the silicide coming into contact with the thin gate silicon oxide of the MOS device. The metals in the silicide tend to poison, i.e., cause deterioration of, the gate oxide which results in a lowering of the dielectric breakdown and eventual current leakage upon applied voltage. This quickly leads to device and circuit failure at high speed or DC applications. In this regard, physical analysis of $TiSi_2$ salicide conductors revealed the presence of the C49 $TiSi_2$ phase at the failing sites. This suggests that incomplete conversion to the low resistance C54 phase can aid the inversion process at high temperature. Agglomeration and inversion are conditions which usually occur together, with the latter requiring higher and/or longer anneal temperatures.

Current ULSI manufacturing processes utilize Rapid Thermal Annealing (RTA) to widen the process window for low resistivity silicide films by allowing the use of high temperature and shorter annealing times. The higher annealing temperatures attainable with RTA change the rate of transformation and improve the formation of low resistance silicide. Shorter annealing times decrease the tendencies for agglomeration. A limitation to RTA, however, is that as linewidths and diffusions are decreased below 0.5 um, the process window for low resistivity silicide formation without agglomeration disappears.

Other manufacturing processes have increased the thickness of silicide film to suppress the tendency of the film to agglomerate. However, for geometries below 0.5 um, a greater thickness of silicide film presents an aggressive aspect ratio that challenges the abilities of the subsequent insulator fill deposition.

Still other manufacturing processes rely on limiting the annealing temperature to below 850 degrees C. and limiting the overall thermal budget.

Accordingly, it is desirable to promote the formation of low resistance silicides and prevent agglomeration of the film during high temperature annealing. Furthermore, a method of manufacturing a silicide structure is necessary such that the metal atoms of a refractory metal or metal silicide are prevented from diffusing through the polysilicon and into the gate oxide during subsequent heat treatments.

SUMMARY OF THE INVENTION

Thus, it is an object of the present invention to provide an improved semiconductor salicide process.

Another object of the present invention is to provide an improved semiconductor salicide process for forming a gate electrode.

A further object of the present invention is to provide a semiconductor salicide process which results in a metal silicide film having increased thermal stability.

Still another object of the present invention is to inhibit the disruption of metal silicide and thereby inhibit the increase of sheet resistance of the thin film due to agglomeration.

Yet another object of the present invention is to provide a semiconductor salicide process which prevents the occurrence of inversion.

In order to accomplish the above and other objects of the present invention, a method of fabricating a conductor includes forming a layer of doped polysilicon on a semiconductor substrate, patterning the layer of doped polysilicon so as to form a conductor, forming a nitrogen-enriched metal film on the conductor, and converting the nitrogen-enriched metal film to a nitrogen-enriched metal silicide film, wherein nitrogen contained in the nitrogen-enriched metal silicide layer provides for improved thermal stability thereof.

BRIEF DESCRIPTION OF THE DRAWINGS

These and other objects, features, aspects and advantages will be more readily apparent and better understood from the following detailed description of the invention, in which:

FIG. 2 is a plot of total annealing time vs. resistance to demonstrate thermal stability of a metal silicide film fabricated in accordance with the present invention as compared to a Control film.

DETAILED DESCRIPTION OF THE PREFERRED EMBODIMENT

Figure 1A:
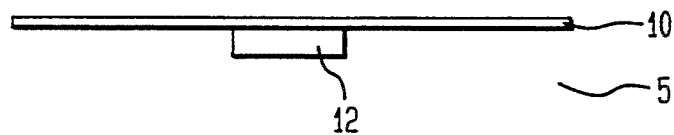
FIGS. 1A, 1B, 1C, 1D, 1E and 1F show process steps for fabrication of a gate electrode structure using a semiconductor salicide process in accordance with the present invention.
Figure 1B:
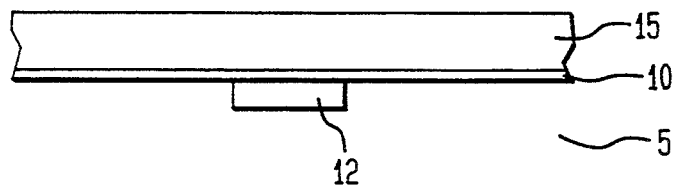
Figure 1C:
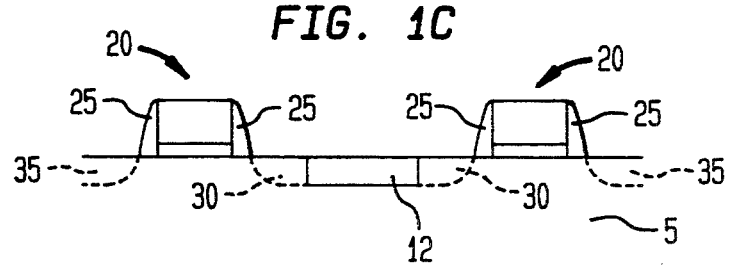
Figure 1D:
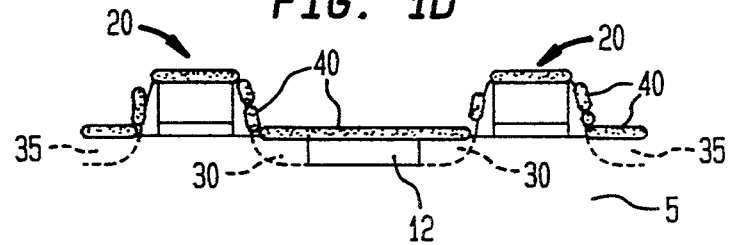
Figure 1E:
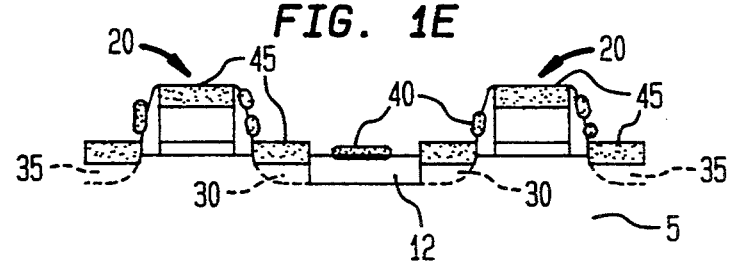
Figure 1F:
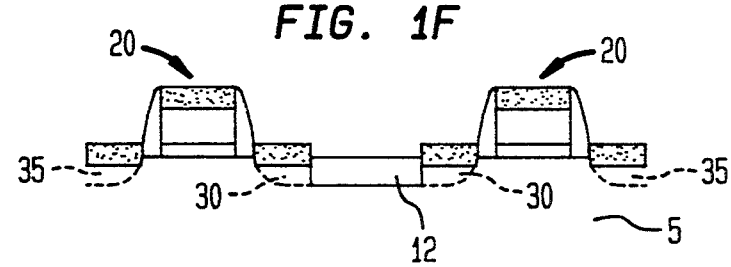

Referring to FIGS. 1A-1F, conventional ion implantation is conducted on a substrate 5 to control threshold voltages, and a gate oxide film 10 is then formed on the substrate 5. The gate oxide film 10 has a thickness, for example, of approximately 80-100 A. As required, an isolation 12 can also be conventionally formed in the substrate 5 for the purpose of separating devices. In the next step, a polysilicon layer 15 is deposited to a thickness of approximately 100-200 nm, followed by conventional ion implantation (arsenic or phosphorus for N+, or boron for P+) to concentrations so as to stabilize the work-function. The implanted polysilicon layer 15 is then annealed at a temperature on the order of, for example, 900 degrees C. to distribute and activate the dopants therein.

Next, the polysilicon layer 15 is patterned to form one or more gate electrode structures 20. Insulating sidewall spacers 25 are then formed on the sidewalls of the gate electrode structures 20 for the purpose of passivation; and suitable dopants are implanted in the substrate 5, and electrically activated for forming source regions 30 and drain regions 35.

In the next step, a nitrogen-enriched thin metal film 40 is formed on the gate electrode structures 20 and on the substrate 5 over the source regions 30 and drain regions 35. Typically, the nitrogen-enriched thin metal film 40 comprises W, Ti, Ta, or other appropriate refractory metal. Further, the nitrogen-enriched thin metal film 40 is generally formed to a thickness on the order of between 150 and 300 Angstroms, and preferably contains 1-3% of nitrogen therein. Note that the metal does not form a film on the insulating sidewall spacers 25 because the metal only reacts with the exposed silicon.

In a preferred embodiment, the nitrogen-enriched thin metal film 40 is formed by sputter depositing. In accordance with the invention, nitrogen is incorporated with sputter process plasma to form a nitrogen-enriched sputter process plasma. The sputter deposition process then proceeds with bombardment of a metal target with ions from the nitrogen-enriched sputter process plasma to displace molecules from the metal target. This causes nitrogen from the nitrogen-enriched sputter process plasma to be incorporated with the molecules displaced from the metal target so as to form the nitrogen-enriched thin metal film 40.

From a perspective of manufacturability, the addition or incorporation of nitrogen to a sputter process plasma can be accomplished as described hereinbelow. A conventional DC magnetron sputter deposition tool can be used, and argon plasma is typically used as the sputter process plasma. The nitrogen can be provided through a calibrated mass flow controller. Typical sputtering conditions may include 2220 Watts (DC) power at a sputtering plasma pressure of approximately 6 milli-Torr, and a wafer chuck temperature set in the range of 100 to 300 degrees C. To incorporate between approximately 1% and 3% of nitrogen in the resulting thin metal film, between approximately 0.5% and 3% of nitrogen is mixed with the sputter process argon plasma during the sputtering process to form an argon-nitrogen plasma. The argon-nitrogen plasma can be ignited under the same conditions as the argon plasma to form the nitrogen-enriched thin metal film 40.

The nitrogen-enriched thin metal film 40 located over the gate electrode structures 20, source regions 30 and drain regions 35 is then converted to a layer of nitrogen-enriched metal silicide 45. Such conversion does not occur between the metal film 40 and either the isolation 12 or the sidewall spacers 25.

In a preferred embodiment, the nitrogen-enriched thin metal film 40 over the gate electrode structure 20, source regions 30 and drain regions 35 is converted to nitrogen-enriched metal silicide 45 by a solid state reaction in a nitrogen ambient, with the nitrogen-enriched thin metal film 40 over the isolation 12, sidewall spacers 25, and any other insulated region of the semiconductor substrate 5 being converted to a metal nitride. More specifically, in the case of Ti, $TiSi_2$ is formed by Rapid Thermal Annealing at times of 10 to 60 seconds and temperatures of between 650 and 700 degrees C. in a nitrogen ambient. The titanium nitride formed during the anneal is stripped using $NH_4OH/H_2O_2$. A second heat treatment is then performed at 850 degrees C. for 10 seconds.

In order to realize the benefits of inhibited agglomeration and inversion during subsequent annealing, it has been found that the nitrogen-enriched metal silicide 45 should contain between approximately 1% and 3% of nitrogen. In this regard, converting the nitrogen-enriched thin metal film containing 1–3% of nitrogen, as described above, to metal silicide will yield the nitrogen-enriched metal silicide 45 containing 1–3% of nitrogen.

The resultant formation of a nitrogen-enriched metal silicide layer shows uniformities of 1% across 200 mm wafers. Proper conditions show uniform nitridation to a level of 1–3 atomic % nitrogen in silicide lead to a stable silicide film during high temperature (1050 degrees C.) annealing.

The nitrogen that is incorporated in the silicide film functions to stabilize the silicide during extended high temperature annealing. FIG. 2 demonstrates that the resistance of a 100 nm $TiSi_2$ film without nitrogen ("Control") begins to quickly increase due to the thermal agglomeration of the silicide film. The same thickness of $TiSi_2$ with 1.5% nitrogen incorporated throughout the film shows less agglomeration and displays a more robust process window at high temperature (1050 degrees C.). Silicide inversion is completely suppressed for silicide films formed in accordance with the present invention. The addition of nitrogen to the silicide is thus shown to improve the thermal stability of the silicide film.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of fabricating a conductor, comprising the steps of:
    (a) providing a semiconductor substrate;
    (b) forming a layer of doped polysilicon on said semiconductor substrate;
    (c) patterning said layer of doped polysilicon so as to form a conductor;
    (d) forming a nitrogen-enriched metal film on said conductor; and
    (e) converting said nitrogen-enriched metal film to a nitrogen-enriched metal silicide film, wherein nitrogen contained in said nitrogen-enriched metal silicide film provides for improved thermal stability including inhibition of agglomeration and inversion of said nitrogen enriched metal silicide film.

2. A method according to claim 1, wherein step (d) comprises sputter depositing using a sputter process plasma.

3. A method according to claim 2, further comprising the step of incorporating nitrogen into said sputter process plasma to form a nitrogen-enriched sputter process plasma.

4. A method according to claim 3, wherein between approximately 0.5% and 3% of nitrogen is incorporated into said sputter process plasma.

5. A method according to claim 3, wherein said sputter deposited nitrogen-enriched metal film includes between approximately 1% and 3% of nitrogen.

6. A method according to claim 2 wherein said sputter process plasma includes argon.

7. A method according to claim 1, wherein step (e) comprises a solid phase reaction.

8. A method according to claim 7, wherein step (d) includes bombarding a metal target with an argon-nitrogen plasma to displace molecules from said metal target, whereby nitrogen from said argon-nitrogen plasma is incorporated with the molecules displaced from said metal target to form said nitrogen-enriched metal film.

9. A method of fabricating a conductor, comprising the steps of:
    (a) providing a semiconductor substrate;
    (b) forming a layer of doped polysilicon on said semiconductor substrate;
    (c) patterning said layer of doped polysilicon so as to form a conductor;
    (d) sputter depositing a nitrogen enriched metal film on said conductor;
    (e) converting said nitrogen-enriched metal film to a nitrogen-enriched metal silicide film, wherein nitrogen contained in said nitrogen-enriched metal silicide film provides for improved thermal stability including inhibition of agglomeration and inversion of said nitrogen enriched metal silicide film.

10. A method of fabricating a semiconductor device, comprising the steps of:
    (a) providing a semiconductor substrate;
    (b) forming a gate oxide film on said semiconductor substrate;
    (c) forming a layer of doped polysilicon on said gate oxide film;
    (d) patterning said layer of doped polysilicon and gate oxide film so as to form a gate electrode structure having sidewalls;
    (e) forming sidewall spacers on said sidewalls of said gate electrode structure;
    (f) forming a source region and a drain region in said semiconductor substrate adjacent to said gate electrode structure;
    (g) forming a nitrogen-enriched metal film on said gate electrode structure, said sidewall spacers and said semiconductor substrate, including over said source region and drain region;
    (h) converting said nitrogen-enriched metal film formed over said gate electrode structure and said source region and drain region to a nitrogen-enriched metal silicide film, wherein nitrogen contained in said nitrogen-enriched metal silicide film provides for improved thermal stability thereof; and
    (i) selectively removing films from said semiconductor substrate and said sidewall spacers such that said nitrogen-enriched metal silicide film remains on said gate electrode structure and on said source and drain regions for forming a semiconductor device.

11. A method according to claim 10, wherein step (g) comprises sputter depositing using a sputter process plasma.

12. A method according to claim 11, further comprising the step of incorporating nitrogen into said sputter process plasma to form a nitrogen-enriched sputter process plasma.

13. A method according to claim 12, wherein between approximately 0.5% and 3% of nitrogen is incorporated into said sputter process plasma.

14. A method according to claim 12, wherein said sputter deposited nitrogen-enriched metal film includes between approximately 1% and 3% of nitrogen.

15. A method according to claim 11, wherein said sputter process plasma includes argon.

16. A method according to claim 10, wherein step (h) comprises a solid phase reaction.

17. A method of fabricating a semiconductor device, comprising the steps of:

(a) providing a semiconductor substrate;

(b) forming a gate oxide film on said semiconductor substrate;

(c) forming a layer of doped polysilicon on said gate oxide film;

(d) patterning said layer of doped polysilicon and gate oxide film so as to form a gate electrode structure having sidewalls;

(e) forming sidewall spacers on said sidewalls of said gate electrode structure;

(f) forming a source region and a drain region in said semiconductor substrate adjacent to said gate electrode structure;

(g) sputter depositing a nitrogen-enriched metal film on said gate electrode structure, said sidewall spacers and said semiconductor substrate, including over said source region and said drain region;

(h) converting said nitrogen-enriched metal film deposited over said gate electrode structure and said source region and drain region to a nitrogen-enriched metal silicide film, wherein nitrogen contained in said nitrogen-enriched metal silicide film provides for improved thermal stability including inhibition of agglomeration and inversion of said nitrogen enriched metal silicide film;

(i) selectively removing films from said semiconductor substrate and said sidewall spacers such that said nitrogen-enriched metal silicide film remains on said gate electrode structure and on said source and drain regions for forming a semiconductor device.

18. A method according to claim 17, wherein step (g) includes bombarding a metal target with an argon-nitrogen plasma to displace molecules from said metal target, whereby nitrogen from said argon-nitrogen plasma is incorporated with the molecules displaced from said metal target to form said nitrogen-enriched metal film.

* * * * *